(12) United States Patent
Deguchi

(10) Patent No.: US 12,482,713 B2
(45) Date of Patent: *Nov. 25, 2025

(54) ELECTRONIC COMPONENT

(71) Applicant: Murata Manufacturing Co., Ltd., Kyoto (JP)

(72) Inventor: Ikuo Deguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 448 days.

This patent is subject to a terminal disclaimer.

(21) Appl. No.: 18/067,844

(22) Filed: Dec. 19, 2022

(65) Prior Publication Data

US 2023/0122767 A1    Apr. 20, 2023

Related U.S. Application Data

(63) Continuation of application No. PCT/JP2021/022109, filed on Jun. 10, 2021.

(30) Foreign Application Priority Data

Jun. 22, 2020  (JP) .................................. 2020-107025

(51) Int. Cl.
*H01L 23/15* (2006.01)
*H01L 23/31* (2006.01)
(Continued)

(52) U.S. Cl.
CPC .......... *H01L 23/15* (2013.01); *H01L 23/3121* (2013.01); *H01L 23/49822* (2013.01); *H01L 23/552* (2013.01); *H05K 3/4629* (2013.01)

(58) Field of Classification Search
CPC . H01L 23/15; H01L 23/49822; H01L 23/552; H05K 1/0218; H05K 2201/0919
See application file for complete search history.

(56) References Cited

U.S. PATENT DOCUMENTS

2009/0002967 A1    1/2009  Asami
2015/0126134 A1*   5/2015  Lobianco .............. H01L 23/552
                                                    361/783
(Continued)

FOREIGN PATENT DOCUMENTS

JP    2009-033114 A    2/2009
JP    2010212410 A     9/2010
(Continued)

OTHER PUBLICATIONS

International Search Report for PCT/JP2021/022109 dated Aug. 3, 2021.
(Continued)

*Primary Examiner* — Ali Naraghi
*Assistant Examiner* — Samuel Jonathan Smith
(74) *Attorney, Agent, or Firm* — McDonald Hopkins LLC

(57) ABSTRACT

An electronic component includes: an insulating substrate including a first main surface and a second main surface opposite to each other in a thickness direction and a side surface with a plurality of ground electrodes exposed thereto; conductive films each covering a surface of a corresponding one of the plurality of ground electrodes exposed to the side surface of the insulating substrate; and a shielding film covering the first main surface and the side surface of the insulating substrate and surfaces of the conductive films. The plurality of ground electrodes includes a first ground electrode and a second ground electrode, the first ground electrode and the second ground electrode being exposed to the side surface of the insulating substrate at a position closest to the first main surface and at a position closest to the second main surface, respectively.

20 Claims, 6 Drawing Sheets

(51) Int. Cl.
　　　　*H01L 23/498*　　　(2006.01)
　　　　*H01L 23/552*　　　(2006.01)
　　　　*H05K 3/46*　　　　(2006.01)

(56) References Cited

U.S. PATENT DOCUMENTS

| | | | |
|---|---|---|---|
| 2016/0073490 A1* | 3/2016 | Branchevsky | H05K 1/0216 |
| | | | 361/783 |
| 2018/0286816 A1 | 10/2018 | Kitazaki et al. | |
| 2018/0286817 A1 | 10/2018 | Kitazaki et al. | |
| 2019/0043662 A1* | 2/2019 | Yamamoto | H01G 4/12 |
| 2019/0295959 A1 | 9/2019 | Ishida et al. | |
| 2023/0119498 A1* | 4/2023 | Deguchi | H01G 4/40 |
| | | | 174/260 |

FOREIGN PATENT DOCUMENTS

| | | |
|---|---|---|
| JP | 2015-012157 A | 1/2015 |
| JP | 2015-91135 A | 5/2015 |
| JP | 2018-046084 A | 3/2018 |
| JP | 2018-170416 A | 11/2018 |
| JP | 2018170419 A | 11/2018 |
| WO | 2017212965 A1 | 12/2017 |

OTHER PUBLICATIONS

International Search Report for PCT/JP2021/022098 dated Aug. 3, 2021.

* cited by examiner

ELECTRONIC COMPONENT

CROSS REFERENCE TO RELATED APPLICATION

This is a continuation of International Application No. PCT/JP2021/022109 filed on Jun. 10, 2021 which claims priority from Japanese Patent Application No. 2020-107025 filed on Jun. 22, 2020. The contents of these applications are incorporated herein by reference in their entireties.

BACKGROUND OF THE DISCLOSURE

Field of the Disclosure

The present disclosure relates to electronic components.

Description of the Related Art

Some electronic components mounted on mobile devices and others are provided with a shielding film to block magnetic waves.

For example, Patent Literature 1 discloses a shielded packaged device including a ceramic multilayer substrate; a die mounted on the upper surface of the ceramic substrate; an overmold encapsulating the die; and a conformal conductive coating covering the upper surface and side surfaces of the overmold and the side surfaces of the ceramic multilayer substrate. The side surfaces of the ceramic multilayer substrate are provided with multiple conductive layers and these conductive layers are electrically connected with the conformal conductive coating so that the conformal conductive coating functions as a shielding film.

PATENT LITERATURE

Patent Literature 1: JP 2015-91135 A

BRIEF SUMMARY OF THE DISCLOSURE

A shielding film on side surfaces of a ceramic multilayer substrate may be formed by sputtering, for example. In order to prevent formation of a shielding film on the mounting surface of a ceramic multilayer substrate, sputtering is performed with the ceramic multilayer substrate being placed such that the surface opposite to the mounting surface faces the target.

In order to improve the electrical connection between the shielding film and conductive layers, conductive films are provided on the surfaces of the conductive layers. Unfortunately, in the case of sputtering, the shielding film is not uniformly formed on the surfaces of the conductive films because the direction in which a film is actually formed by sputtering does not match the direction in which the shielding film is desired to be formed. Specifically, the shielding film is formed preferentially at a portion closer to the target on the surfaces of the conductive films, while formation of the shielding film is inhibited at a portion farther from the target because the conductive film itself serves as an eaves (roof). This issue is more significant as the conductive layer is farther from the target.

Thus, the ceramic multilayer substrate disclosed in Patent Literature 1 involves an issue in which the shielding film is not sufficiently formed on the surface of the conductive layer at a position farther from the target, resulting in poor electrical connection and poor reliability.

The present disclosure is made to solve the above issue and aims to provide an electronic component having high electrical connection and high reliability.

The electronic component of the present disclosure includes: an insulating substrate including a first main surface, a second main surface, a side surface and a plurality of ground electrodes, the first main surface and the second main surface being opposite to each other in a thickness direction, and the plurality of ground electrodes being exposed to the side surface; conductive films each covering a surface of a corresponding one of the plurality of ground electrodes exposed to the side surface of the insulating substrate; and a shielding film covering the first main surface and the side surface of the insulating substrate and surfaces of the conductive films, the plurality of ground electrodes including a first ground electrode and a second ground electrode on a same side surface of the insulating substrate, the first ground electrode being exposed to the side surface of the insulating substrate at a position closest to the first main surface of the insulating substrate and the second ground electrode being exposed to the side surface of the insulating substrate at a position closest to the second main surface of the insulating substrate, the conductive films including a first conductive film covering a surface of the first ground electrode and a second conductive film covering a surface of the second ground electrode, a thickness of the second conductive film being less than a thickness of the first conductive film.

The present disclosure can provide an electronic component having high electrical connection and high reliability.

DETAILED DESCRIPTION OF THE DISCLOSURE

The electronic component of the present disclosure is described hereinbelow.

The present disclosure is not limited to the following preferred embodiments, and may be suitably modified without departing from the gist of the present disclosure. Combinations of two or more preferred structures described in the following are also within the scope of the present disclosure.

<Electronic Component>

The electronic component of the present disclosure includes: an insulating substrate including a first main surface and a second main surface opposite to each other in a thickness direction and a side surface with a plurality of ground electrodes exposed thereto; conductive films each covering a surface of a corresponding one of the plurality of ground electrodes exposed to the side surface of the insulating substrate; and a shielding film covering the first main surface and the side surface of the insulating substrate and surfaces of the conductive films, the plurality of ground electrodes including a first ground electrode and a second ground electrode on a same side surface of the insulating substrate, the first ground electrode being exposed to the side surface of the insulating substrate at a position closest to the first main surface of the insulating substrate and the second ground electrode being exposed to the side surface of the insulating substrate at a position closest to the second main surface of the insulating substrate, the conductive films including a first conductive film covering a surface of the first ground electrode and a second conductive film covering a surface of the second ground electrode, a thickness of the second conductive film being smaller than a thickness of the first conductive film.

In the electronic component of the present disclosure, the thickness of the second conductive film covering the surface of the second ground electrode at a position closest to the second main surface of the insulating substrate among the ground electrodes is smaller than the thickness of the first conductive film covering the surface of the first ground electrode at a position closest to the first main surface of the insulating substrate. Thus, the shielding film can have a sufficient thickness on the second conductive film, which is placed at a position farthest from the target during formation of the shielding film. This can improve the electrical connection between the ground electrodes and the shielding film and the reliability.

An example of the structure of the electronic component is described with reference to FIG. 1 and FIG. 2.

Figure 1:
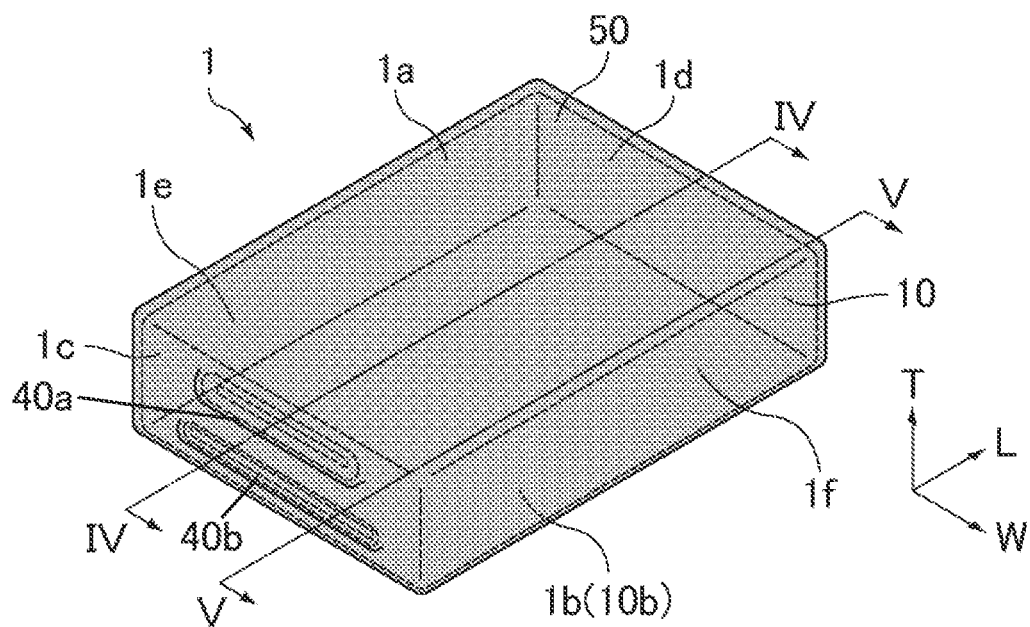
FIG. 1 is a schematic perspective view of an example of an electronic component.

FIG. 1 is a schematic perspective view of an example of the electronic component. FIG. 2 is a schematic perspective view of an insulating substrate defining the electronic component illustrated in FIG. 1.

An electronic component 1 illustrated in FIG. 1 includes an insulating substrate 10, conductive films (a first conductive film 40a and a second conductive film 40b), and a shielding film 50 covering one of the main surfaces (a first main surface 10a) and four side surfaces (a first side surface 10c, a second side surface 10d, a third side surface 10e, and a fourth side surface 10f) among the surfaces of the insulating substrate 10. The shielding film 50 also covers the surfaces of the conductive films.

The electronic component 1 has a shape including a first main surface 1a and a second main surface 1b opposite to each other in the thickness direction (the direction indicated by an arrow T in FIG. 1), a first side surface 1c and a second side surface 1d opposite to each other in the length direction (the direction indicated by an arrow L in FIG. 1) perpendicular to the thickness direction, and a third side surface 1e and a fourth side surface 1f opposite to each other in the width direction (the direction indicated by an arrow W in FIG. 1) perpendicular to the thickness direction and the length direction.

The shielding film 50 is provided on the first main surface 1a, the first side surface 1c, the second side surface 1d, the third side surface 1e, and the fourth side surface 1f of the electronic component 1, but is not provided on the second main surface 1b thereof.

A second main surface 10b of the insulating substrate 10 is exposed to the second main surface 1b.

The second main surface 1b, which is not provided with the shielding film 50, of the electronic component 1 serves as a mounting surface.

Figure 2:
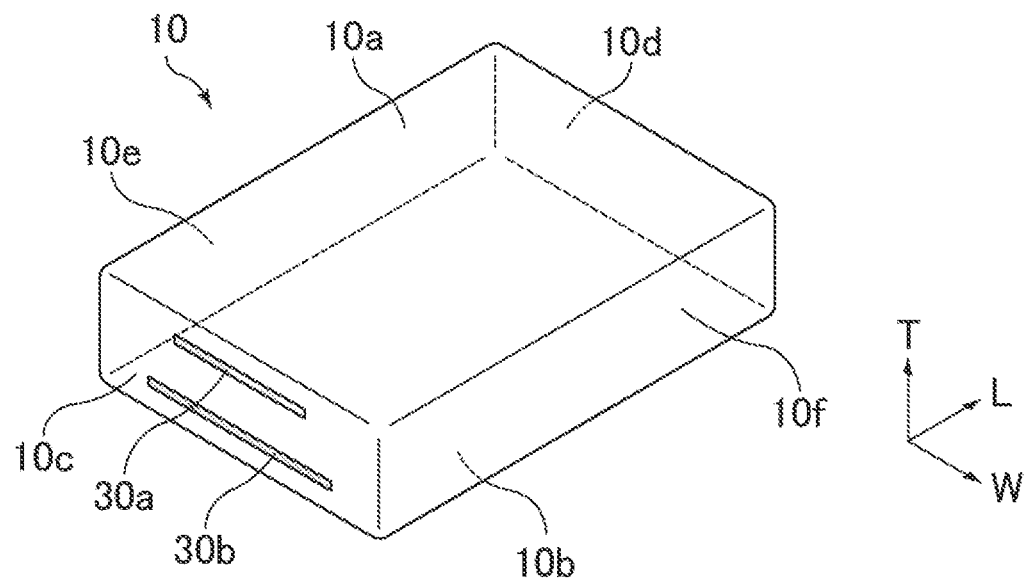
FIG. 2 is a schematic perspective view of an insulating substrate defining the electronic component illustrated in FIG. 1.

As illustrated in FIG. 2, the insulating substrate 10 defining the electronic component 1 includes a plurality of ground electrodes (a first ground electrode 30a and a second ground electrode 30b). The insulating substrate 10 has a substantially cubic shape including the first main surface 10a and the second main surface 10b opposite to each other in the thickness direction (the direction indicated by an arrow T in FIG. 2), the first side surface 10c and the second side surface 10d opposite to each other in the length direction (the direction indicated by an arrow L in FIG. 2) perpendicular to the thickness direction, and the third side surface 10e and the fourth side surface 10f opposite to each other in the width direction (the direction indicated by an arrow W in FIG. 2) perpendicular to the thickness direction and the length direction.

The ground electrodes provided at different layers of the insulating substrate 10 are exposed to the first side surface 10c.

The ground electrodes exposed to the first side surface 10c includes the first ground electrode 30a exposed to the first side surface 10c of the insulating substrate 10 at a position closest to the first main surface 10a and the second ground electrode 30b exposed to the first side surface 10c of the insulating substrate 10 at a position closest to the second main surface 10b.

The first ground electrode 30a and the second ground electrode 30b at the first side surface 10c overlap each other in the thickness direction of the insulating substrate 10. Alternatively, the first ground electrode 30a and the second ground electrode 30b may not overlap each other in the thickness direction.

The first ground electrode 30a and the second ground electrode 30b may be exposed to a different side surface of the insulating substrate 10.

Figure 3:
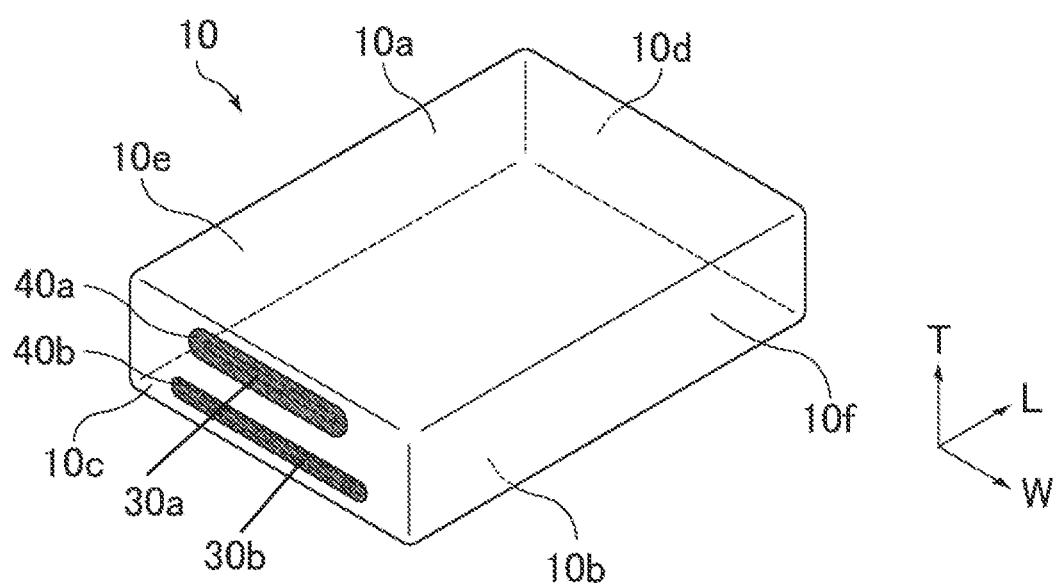
FIG. 3 is a schematic perspective view of the electronic component illustrated in FIG. 1 with a shielding film removed therefrom.

FIG. 3 is a schematic perspective view of the electronic component illustrated in FIG. 1 with the shielding film removed therefrom.

As illustrated in FIG. 3, the surface of the first ground electrode 30a and the surface of the second ground electrode 30b exposed to the first side surface 10c of the insulating substrate 10 are respectively provided with the first conductive film 40a and the second conductive film 40b.

The first conductive film 40a and the second conductive film 40b are formed by plating the first ground electrode 30a and the second ground electrode 30b. Thus, the first conductive film 40a and the second conductive film 40b protrude from the first side surface 10c of the insulating substrate 10.

Figure 4:
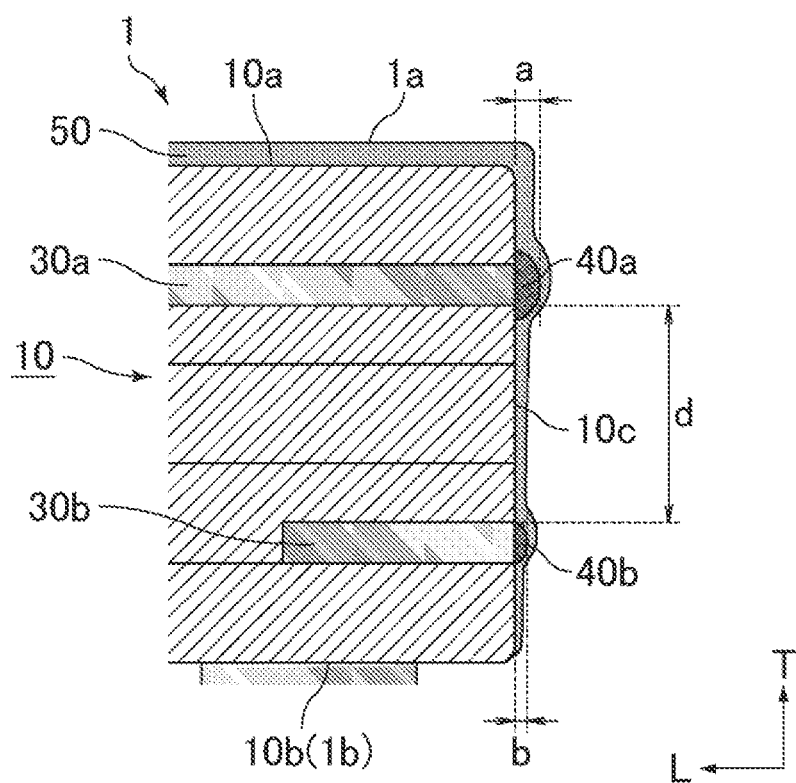
FIG. 4 is a cross-sectional view of the electronic component illustrated in FIG. 1 taken along the IV-IV line.

FIG. 4 is a cross-sectional view of the electronic component illustrated in FIG. 1 taken along the IV-IV line.

FIG. 4 is also an enlarged view of the first side surface 10c and its vicinity of the insulating substrate 10 of the electronic component 1 illustrated in FIG. 1.

As illustrated in FIG. 4, the surface of the first ground electrode 30a is covered with the first conductive film 40a. The surface of the second ground electrode 30b is covered with the second conductive film 40b.

The thickness (the length indicated by a double-headed arrow b in FIG. 4) of the second conductive film 40b is smaller than the thickness (the length indicated by a double-headed arrow a in FIG. 4) of the first conductive film 40a.

Adjusting the thickness b of the second conductive film 40b to be smaller than the thickness a of the first conductive film 40a allows the shielding film 50 to have a sufficient thickness at a portion below (a portion closer to the second main surface of) the second conductive film 40b, which is placed at a position farthest from the target during sputtering. This can improve the electrical connection between the second ground electrode 30b and the shielding film 50 and the reliability.

As illustrated in FIG. 4, the thickness of the shielding film 50 is tapered toward the second main surface 10b of the insulating substrate 10. For the thicknesses of the shielding film 50 on the surfaces of the first conductive film 40a and the second conductive film 40b, the thickness of the shielding film 50 on the surface at a portion closer to the second main surface 10b is smaller than the thickness of the shielding film 50 on the surface at a portion closer to the first main surface 10a.

In FIG. 4, i.e., in a side view of the insulating substrate 10, the distance between the first ground electrode 30a and the second ground electrode 30b (the length indicated by a double-headed arrow d in FIG. 4) is not smaller than the thickness a of the first conductive film 40a. If the distance d between the first ground electrode 30a and the second ground electrode 30b is smaller than the thickness a of the first conductive film 40a, the first ground electrode 30a and the second ground electrode 30b are so close that the shielding film 50 may fail to have a sufficient thickness on the surface of the second conductive film 40b.

Figure 5:
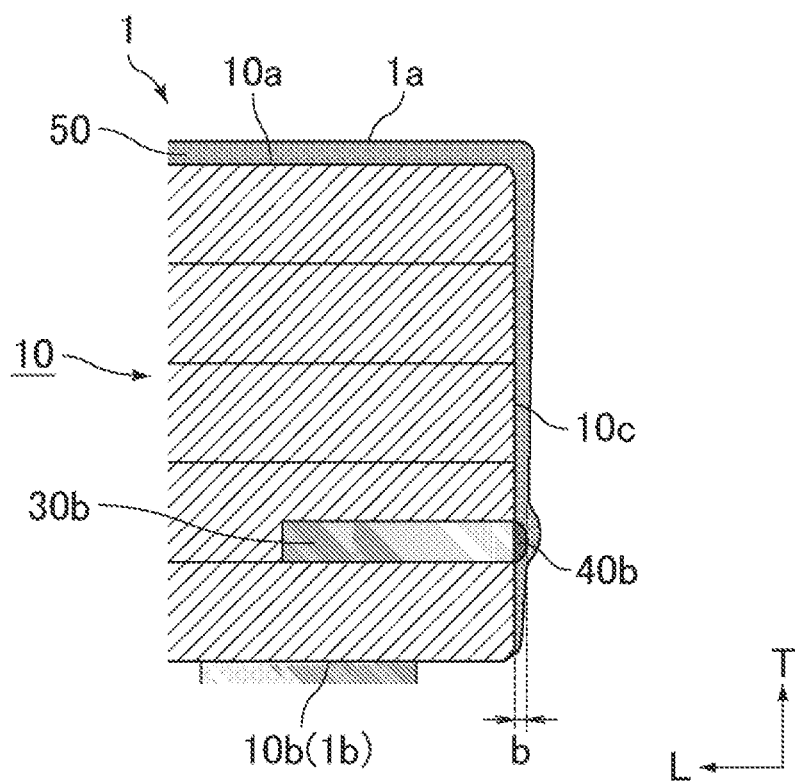
FIG. 5 is a cross-sectional view of the electronic component illustrated in FIG. 1 taken along the V-V line.

FIG. 5 is a cross-sectional view of the electronic component illustrated in FIG. 1 taken along the V-V line.

As illustrated in FIG. 5, the thickness of the shielding film 50 on the second conductive film 40b provided on the surface of the second ground electrode 30b at a portion where the first ground electrode is not exposed to the first main surface 10a of the insulating substrate 10 is greater than the thickness of the shielding film 50 on the second conductive film 40b provided on the surface of the second ground electrode 30b at a portion where the first ground electrode 30a is exposed to the first main surface 10a of the insulating substrate 10 as illustrated in FIG. 4.

<Insulating Substrate>

The insulating substrate may be, for example, a stack of an insulating layer containing an insulating material and a conductive line layer to serve as a conductive line.

Examples of the insulating material contained in the insulating layer include an insulating resin and a ceramic material.

An insulating substrate formed from an insulating resin as an insulating material is also referred to as a resin substrate, while an insulating substrate formed from a ceramic material as an insulating material is also referred to as a ceramic substrate.

Examples of the ceramic material contained in the insulating layer include a high temperature co-fired ceramic (HTCC) material and a low temperature co-fired ceramic (LTCC) material.

The low temperature co-fired ceramic material means a ceramic material sinterable at a firing temperature of 1000° C. or lower and is co-fireable with a metallic material, preferably such as silver or copper, used to form a conductive line.

Examples of the low temperature co-fired ceramic material include those containing $SiO_2$—$CaO$—$Al_2O_3$—$B_2O_3$ glass ceramic or $SiO_2$—$MgO$—$Al_2O_3$—$B_2O_3$ glass ceramic.

Alumina powder may also be used as a ceramic material.

Examples of the insulating resin include epoxy resin, polyimide resin, and a liquid crystal polymer.

For example, the conductive line layer defines a passive element such as a capacitor or an inductor or defines a connection line that provides an electrical connection between elements.

Examples of the material defining the conductive line layer include silver and copper.

The conductive line layer may contain an insulating resin or a ceramic material.

The ceramic material contained in the conductive line layer may be the same as the ceramic material contained in the insulating layer. The insulating resin contained in the conductive line layer may be the same as the insulating resin contained in the insulating layer.

In the case where the conductive line layer contains not only a metallic material but also the same insulating material as the insulating material contained in the insulating layer, these materials are collectively referred to as a combined base material. For example, the composition of the combined base material may be such that the proportion of the metallic material to the total weight of the metallic material and the insulating material is 75% by weight or more and 95% by weight or less.

The insulating substrate may have any shape, such as a substantially cubic shape having a first main surface and a second main surface opposite to each other in the thickness direction, a first side surface and a second side surface opposite to each other in the length direction perpendicular to the thickness direction, and a third side surface and a fourth side surface opposite to each other in the width direction perpendicular to the thickness direction and the length direction.

The shape of the insulating substrate may be, for example, a substantially cubic shape in which the insulating substrate has a thickness of 350 μm or greater and 1400 μm or smaller, a length of 1000 μm or greater and 4000 μm or smaller, and a width of 625 μm or greater and 2500 μm or smaller.

The second main surface of the insulating substrate may be provided with an electrode.

In this case, the shielding film may not be electrically connected to the electrode provided at the second main surface of the insulating substrate.

The electrode provided at the second main surface of the insulating substrate may be a ground electrode or may be a different electrode (circuit electrode).

A ground electrode that is provided at the second main surface of the insulating substrate but is not exposed to a side surface of the insulating substrate does not correspond to the second ground electrode.

<Ground Electrodes>

Each ground electrode is a portion of the conductive line layer provided inside the insulating substrate and is a portion exposed to a side surface of the insulating substrate and electrically connected to the shielding film.

Using copper as a material of the ground electrodes can improve the plating adhesion. The ground electrodes may have a composition containing no insulating material such as an insulating resin or a ceramic material, or may be formed from a combined base material containing the same insulating material as that in the insulating layer.

A plurality of the ground electrodes are provided at different layers of the insulating substrate.

Each ground electrode is exposed to a side surface of the insulating substrate and is electrically connected to the shielding film via the conductive film.

Two or more ground electrodes are exposed at different positions in the thickness direction of the insulating substrate.

The ground electrodes each may have any thickness, such as 5 μm or greater and 20 μm or smaller.

The ground electrode that is exposed to a side surface of the insulating substrate at a position closest to the first main surface among the ground electrodes is defined as the first ground electrode.

The ground electrode that is exposed to a side surface of the insulating substrate at a position closest to the second main surface among the ground electrodes is defined as the second ground electrode.

The first ground electrode and the second ground electrode are provided at different layers of the insulating substrate.

The first ground electrode and the second ground electrode are exposed to the same side surface of the insulating substrate. In a side view of the insulating substrate, the first ground electrode and the second ground electrode may be exposed such that they overlap each other in the thickness direction or may be exposed such that they do not overlap each other.

The first ground electrode and the second ground electrode are determined for each side surface of the insulating substrate. Thus, the first ground electrode at one side surface of the insulating substrate and the first ground electrode at another side surface of the insulating substrate may not communicate with each other inside the insulating substrate.

In the electronic component, at least one side surface of the insulating substrate satisfies that the thickness of the second conductive film is smaller than the thickness of the first conductive film. In the case where two or more side surfaces of the insulating substrate each include the first ground electrode and the second ground electrode, the thickness of the second conductive film may be smaller than the thickness of the first conductive film at every side surface.

The electrical resistivity of the second ground electrode may be higher than the electrical resistivity of the first ground electrode.

Adjusting the electrical resistivity of the second ground electrode to be higher than the electrical resistivity of the first ground electrode causes an electric current to less easily flow through a portion to be provided with the conductive film for the second ground electrode than through a portion to be provided with the conductive film for the first ground electrode during the plating treatment for forming the conductive films. As a result, the thickness of the second conductive film on the surface of the second ground electrode is more easily made smaller than the thickness of the first conductive film on the surface of the first ground electrode.

The electrical resistivity of the second ground electrode may be made higher than the electrical resistivity of the first ground electrode by, for example, a method in which the amount of the ceramic component contained in the second ground electrode is made larger than the amount of the ceramic component contained in the first ground electrode, or a method in which the metallic component to be contained in the second ground electrode is one having a higher electrical resistivity than the metallic component to be contained in the first ground electrode.

The electrical resistivity of the first ground electrode may be $1.5 \times 10^{-6}$ Ω·cm or higher and $5.0 \times 10^{-6}$ Ω·cm or lower, for example.

The electrical resistivity of the second ground electrode may be $3.0 \times 10^{-6}$ Ω·cm or higher and $5.0 \times 10^{-3}$ Ω·cm or lower, for example.

The total area of the second ground electrode exposed to a surface of the insulating substrate may be smaller than the total area of the first ground electrode exposed to the surface of the insulating substrate. The smaller the total area of the ground electrode exposed to the surface of the insulating substrate, the less easily an electric current flows through the ground electrode during the plating treatment for forming the conductive films. Accordingly, the thickness of the second conductive film on the surface of the second ground electrode is more easily made smaller than the thickness of the first conductive film on the first ground electrode.

In a side view of the insulating substrate, the length of a single ground electrode in the direction perpendicular to the thickness direction of the insulating substrate may be 50 μm or greater and 400 μm or smaller.

In a side view of the insulating substrate, the exposed area of the second ground electrode may be smaller than the exposed area of the first ground electrode.

In the step of forming a conductive film on the surface of a ground electrode, the higher the electrical resistivity between a plating solution and the ground electrode is, the smaller the electric current applied is and the thinner the resulting conductive film is.

Thus, adjusting the exposed area of the second ground electrode to be smaller than the exposed area of the first ground electrode causes the electric current generated between the second ground electrode and the plating solution to be smaller than the electric current flowing between the first ground electrode and the plating solution, resulting in a relatively thin conductive film on the surface of the second ground electrode.

The conductive films are each formed so as to cover the surface of a ground electrode exposed to a side surface of the insulating substrate. Thus, in the case where the exposed area of the second ground electrode is smaller than the exposed area of the first ground electrode, the contact area between the second ground electrode and the second conductive film is smaller than the contact area between the first ground electrode and the first conductive film.

The exposed areas of the first ground electrode and the second ground electrode each may be adjusted by, for example, a method of changing the thickness of the ground electrode or a method of changing the length (the length in the direction perpendicular to the thickness direction) of the ground electrode in a side view of the insulating substrate.

A third ground electrode different from the first ground electrode and the second ground electrode may be exposed to a side surface of the insulating substrate.

In the case where only a single ground electrode is exposed to one side surface of the insulating substrate, this ground electrode corresponds to the third ground electrode.

In the case where three or more ground electrodes are exposed to one side surface of the insulating substrate, the ground electrode closest to the first main surface corresponds to the first ground electrode, the ground electrode closest to the second main surface corresponds to the second ground electrode, and any other ground electrode corresponds to the third ground electrode.

<Conductive Films>

Conductive films covering the respective ground electrodes are provided on the surfaces of the ground electrodes exposed to a side surface of the insulating substrate.

The material defining the conductive films may be selected as appropriate in accordance with the material defining the ground electrodes to serve as bases (hereinafter, also referred to as base electrodes) and the material defining the shielding film.

Examples of the material defining the conductive films include Ni, Sn, and Au, and two or more species may be used in combination.

The material defining the conductive films may be a material having higher malleability than the material defining the ground electrodes.

The conductive films may be formed by plating, for example.

Each conductive film may have two or more layers.

The first layer of the conductive film may be an electroplated layer formed by electroplating.

For the conductive film having two or more layers, examples of the layers include a combination of an electroplated Ni layer and an electroplated Sn layer and a combination of an electroplated Ni layer and an electroless-plated Au layer.

Using Ni as a material defining the first layer of the conductive film can improve the connection with the base electrode in the case where the ground electrode serving as the base contains Cu or Ag.

The conductive film covering the surface of the first ground electrode among the conductive films is referred to as a first conductive film.

The conductive film covering the surface of the second ground electrode among the conductive films is referred to as a second conductive film.

The thickness of the second conductive film is smaller than the thickness of the first conductive film.

The first conductive film and the second conductive film may have the same composition or may have different compositions.

The thicknesses of the first conductive film and the second conductive film can be measured by, for example, SEM observation on a cross section obtained by cutting the electronic component along the direction perpendicular to the side surface of the insulating substrate provided with the conductive films and perpendicular to the thickness direction of the insulating substrate.

In the case where a conductive film includes two or more layers, the thickness of the conductive film is the sum of the thicknesses of the respective layers.

The thickness of each conductive film may be 1 μm or greater and 7 μm or smaller.

A conductive film having a thickness of smaller than 1 μm may cause poor connection between the corresponding ground electrode and the shielding film.

A conductive film having a thickness of greater than 7 μm may cause insufficient formation of the shielding film at a position farther (from the target) than the conductive film in the step of forming the shielding film.

The thickness of the second conductive film may be 1 μm or greater and 3 μm or smaller, for example.

A second conductive film having a thickness of greater than 3 μm may cause the shielding film to have insufficient thickness on the surface of the second conductive film.

The thickness of the first conductive film may be 3 μm or greater and 7 μm or smaller, for example.

The contact area between the second ground electrode and the second conductive film may be smaller than the contact area between the first ground electrode and the first conductive film.

Adjusting the contact area between the second ground electrode and the second conductive film to be smaller than the contact area between the first ground electrode and the first conductive film causes the contact area between the second ground electrode and the plating solution to be smaller than the contact area between the first ground electrode and the plating solution during the plating treatment for forming the conductive films, which causes an electric current flowing through the second ground electrode to be lower than an electric current flowing through the first ground electrode. As a result, the thickness of the second conductive film on the surface of the second ground electrode is more easily made smaller than the thickness of the first conductive film on the surface of the first ground electrode.

The contact area between the second ground electrode and the second conductive film may be made smaller than the contact area between the first ground electrode and the first conductive film by, for example, a method of adjusting the thickness of the second ground electrode to be smaller than the thickness of the first ground electrode or a method of adjusting the length of the second ground electrode to be smaller than the length of the first ground electrode, thereby adjusting the area of the second ground electrode exposed to a side surface of the insulating substrate to be smaller than the area of the first ground electrode exposed to the side surface of the insulating substrate.

<Shielding Film>

The shielding film covers at least side surfaces among the surfaces of the insulating substrate.

The shielding film is a metal film formed by sputtering.

The shielding film may have any average thickness, such as 1 μm or greater and 50 μm or smaller.

The shielding film may have a single layer, or may have a multilayer structure.

An example of the multilayer structure of the shielding film is a structure sequentially including an adhesive layer, a conductive layer, and an anticorrosive layer from the side close to the insulating substrate.

Examples of the material defining the adhesive layer include metals such as SUS, Cu, Ti, Cr, Ni, and TiAl.

Examples of the material defining the conductive layer include metals such as Cu, Ni, Ag, and Al.

Examples of the material defining the anticorrosive layer include metals such as SUS, Ti, Cr, and TiAl and metals having a high magnetic permeability such as Ni and permalloy.

The adhesive layer, the conductive layer, and the anticorrosive layer each may be formed by sputtering.

Examples of the shielding film include those including any one of the adhesive layer, the conductive layer, and the anticorrosive layer, and those including all of the adhesive layer, the conductive layer, and the anticorrosive layer.

Figure 6:
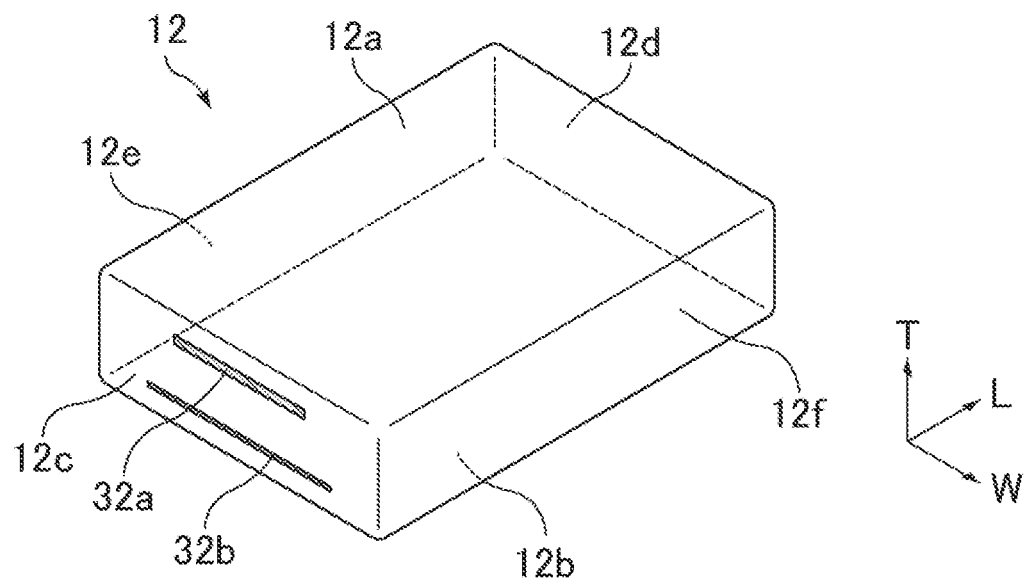
FIG. 6 is a schematic perspective view of another example of the insulating substrate.

FIG. 6 is a schematic perspective view of another example of the insulating substrate.

The structure of an insulating substrate 12 illustrated in FIG. 6 is the same as that of the insulating substrate 10 described with reference to FIG. 2 except for the shapes of a first ground electrode 32a and a second ground electrode 32b.

In the insulating substrate 12 illustrated in FIG. 6, the first ground electrode 32a and the second ground electrode 32b are exposed to a first side surface 12c.

The length of the first ground electrode 32a is smaller than the length of the second ground electrode 32b. The thickness of the first ground electrode 32a is greater than the thickness of the second ground electrode 32b. Accordingly, in the insulating substrate 12 illustrated in FIG. 6, the exposed area of the first ground electrode 32a is larger than the exposed area of the second ground electrode 32b.

Adjusting the exposed area of the first ground electrode 32a to be larger than the exposed area of the second ground electrode 32b allows the thickness of the first conductive film to be made greater than the thickness of the second conductive film during the plating treatment for forming the conductive films.

Figure 7:
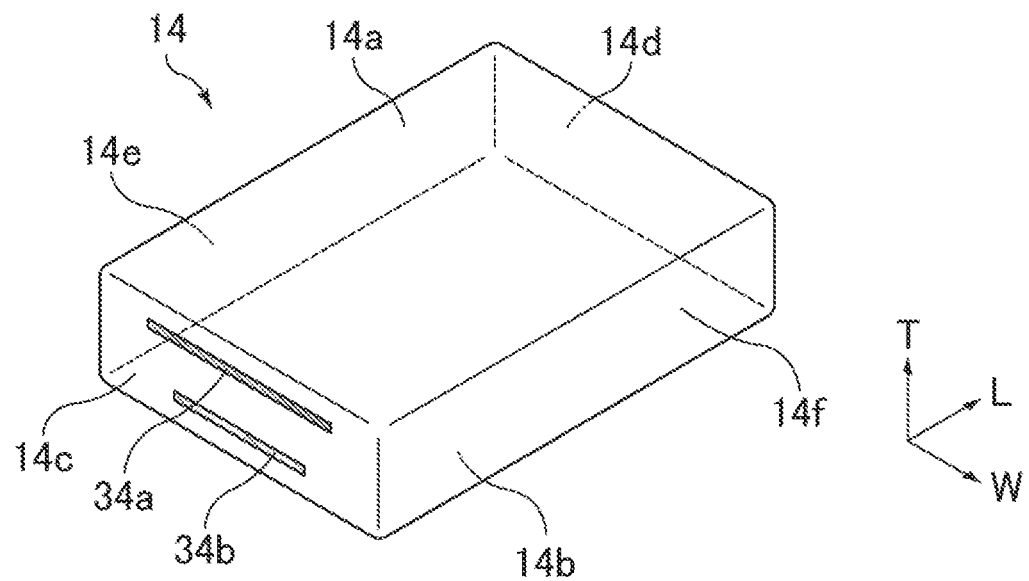
FIG. 7 is a schematic perspective view of still another example of the insulating substrate.

FIG. 7 is a schematic perspective view of still another example of the insulating substrate.

The structure of an insulating substrate 14 illustrated in FIG. 7 is the same as that of the insulating substrate 10 described with reference to FIG. 2 except for the shapes of a first ground electrode 34a and a second ground electrode 34b.

In the insulating substrate 14 illustrated in FIG. 7, the first ground electrode 34a and the second ground electrode 34b are exposed to a first side surface 14c.

The thickness of the first ground electrode 34a is equal to the thickness of the second ground electrode 34b. The length of the first ground electrode 34a is greater than the length of the second ground electrode 34b. Accordingly, in the insulating substrate 14 illustrated in FIG. 7, the exposed area of the first ground electrode 34a is larger than the exposed area of the second ground electrode 34b.

Adjusting the exposed area of the first ground electrode 34a to be larger than the exposed area of the second ground electrode 34b allows the thickness of the first conductive film to be made greater than the thickness of the second conductive film during the plating treatment for forming the conductive films.

Figure 8:
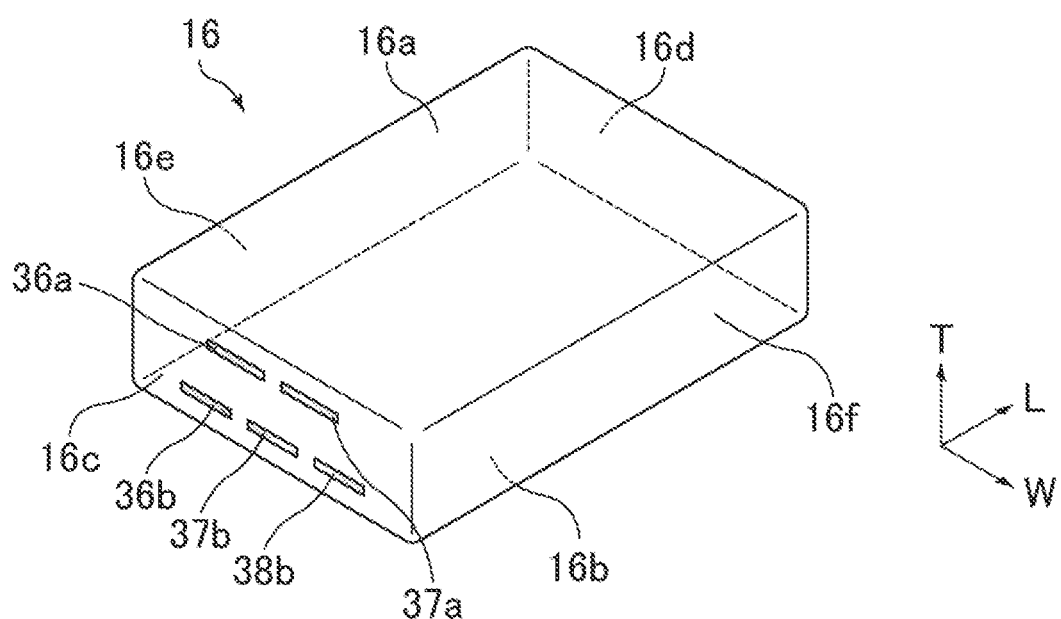
FIG. 8 is a schematic perspective view of yet another example of the insulating substrate.

FIG. 8 is a schematic perspective view of yet another example of the insulating substrate.

The structure of an insulating substrate 16 illustrated in FIG. 8 is the same as that of the insulating substrate 10 described with reference FIG. 2 except for the presence of multiple first ground electrodes and multiple second ground electrodes.

Two first ground electrodes 36a and 37a and three second ground electrodes 36b, 37b, and 38b are exposed to a first side surface 16c of the insulating substrate 16.

The length of the first ground electrode in this case refers to the sum of the length of the first ground electrode 36a and the length of the first ground electrode 37a. Similarly, the length of the second ground electrode in this case refers to the sum of the length of the second ground electrode 36b, the length of the second ground electrode 37b, and the length of the second ground electrode 38b.

As illustrated in FIG. 8, multiple first ground electrodes and multiple second ground electrodes may be present.

In the case where two or more ground electrodes are exposed to a side surface of the insulating substrate at a position closest to the first main surface, all of these correspond to the first ground electrode. In the case where two or more ground electrodes are exposed to a side surface of the insulating substrate at a position closest to the second main surface, all of these correspond to the second ground electrode.

In the case where multiple first ground electrodes are present, the length and exposed area of the first ground electrode respectively refer to the sum of the lengths of all first ground electrodes and the sum of the exposed areas of all first ground electrodes. Similarly, in the case where multiple second ground electrodes are present, the length and exposed area of the second ground electrode respectively refer to the sum of the lengths of all second ground electrodes and the sum of the exposed areas of all second ground electrodes.

In the insulating substrate 16 illustrated in FIG. 8, the total area of the first ground electrodes 36a and 37a exposed to the first side surface 16c is smaller than the total area of the second ground electrodes 36b, 37b, and 38b exposed to the first side surface 16c. In this case, the electrical resistivity of the first ground electrodes 36a and 37a is preferably lower than the electrical resistivity of the second ground electrodes 36b, 37b, and 38b. Adjusting the electrical resistivity of the first ground electrodes 36a and 37a to be smaller than the electrical resistivity of the second ground electrodes 36b, 37b, and 38b allows the thicknesses of the first conductive films formed on the surfaces of the first ground electrodes 36a and 37a to be made greater than the thicknesses of the second conductive films formed on the second ground electrodes 36b, 37b, and 38b.

<Method for Producing Electronic Component>

Next, an example of a method for producing an electronic component is described.

Described below is a case where a LTCC material is used as a ceramic material.

First, LTCC green sheets to define ceramic layers are produced.

In this case, predetermined amounts of a ceramic powder, a binder, and a plasticizer are mixed, whereby slurry is prepared. The resulting slurry is applied to a carrier film for sheet formation, whereby a green sheet is produced. The slurry may be applied to the carrier film using a lip coater, a doctor blade, or the like.

The green sheet may have any thickness, such as 4 μm or greater and 100 μm or smaller.

Next, the green sheet is provided with a via hole at a predetermined site. The via hole may be formed by punching or laser processing, for example.

The via hole may have any diameter, such as 20 μm or greater and 200 μm or smaller.

Next, the via hole is filled with conductive paste. The conductive paste filling the via hole is fired to form a via conductor.

The conductive paste may be prepared by mixing powder of Cu or other metal, a plasticizer, an organic solvent, and other components with a binder. This conductive paste may be further combined with a ceramic material.

Next, conductive paste is printed on a main surface of the green sheet.

The conductive paste used in this step may be prepared by mixing Cu powder, glass powder, a plasticizer, an organic solvent, and other components with a binder.

The conductive paste may be printed by screen printing, inkjet printing, gravure printing, or the like.

The printed conductive paste is fired to form a conductive line layer.

Next, multiple green sheets each provided with the conductive paste to serve as a conductive line layer and the conductive paste to serve as a via conductor are stacked, and this stack is compressed in a mold. The pressure and the temperature at this step may be set as appropriate.

Next, the compressed stack is singulated.

Singulation may be performed by dicing, guillotine cutting, laser cutting, or the like.

If necessary, the singulated stacks may be subjected to barrel finishing.

The conductive line layers exposed to a side surface of a stack by singulation serve as ground electrodes.

Barrel finishing may be performed by putting a stack and media into a pot of a rotary barrel and rotating the pot, for example.

In order to prevent cracking or chipping of the stack, the inside of the pot may be coated with an elastic material such as rubber.

Next, the singulated stacks are fired.

In the case of a Cu-based conductive paste, the stacks are preferably fired in a reducing atmosphere (e.g., $N_2$ atmosphere).

The stacks may be arranged in a firing setter.

The firing may be performed in a batch manner or in a belt (continuous) manner.

Then, the surfaces of the ground electrodes exposed to a side surface of the insulating substrate are plated. This plating treatment on the surfaces of the ground electrodes forms conductive films that improve the connection between the ground electrodes and the shielding film. The ground electrode closest to the second main surface, which is to be the mounting surface, corresponds to the second ground electrode, while the ground electrode closest to the opposite first main surface corresponds to the first ground electrode.

Examples of the plated layer formed by the plating treatment include a combination of a plated Ni layer and a plated Sn layer and a combination of a plated Ni layer and an electroless-plated Au layer.

These steps provide an insulating substrate.

The first main surface and/or the second main surface of the insulating substrate may be provided with any component such as an electronic component or may be encapsulated with a mold resin.

The mold resin used may be a common encapsulating resin such as a glass epoxy resin, for example.

Then, multiple insulating substrates are arranged in a tray for sputtering.

In order to prevent unnecessary deposition of the sputtering film (shielding film) on the surface to be the mounting surface (the second main surface) of each insulating substrate, paste or tape may be attached to this surface in advance.

Adjacent insulating substrates arranged in the tray may be apart from each other at any distance, such as 0.5 μm or greater and 5 mm or smaller.

If necessary, dry etching may be performed before sputtering.

Dry etching may be performed using an Ar ion gun.

Dry etching enables washing of the insulating substrates as well as coarsening of the surfaces of the insulating substrates, improving the adhesive strength of the shielding film.

Next, the tray for sputtering is placed inside the chamber of a sputtering device and an adhesive layer is formed.

Formation of the adhesive layer is achieved by applying a voltage to a SUS target for a predetermined period of time. The thickness thereof may be, for example, about 0.01 μm or greater and about 0.5 μm or smaller.

Instead of the SUS target, a Ti, Cr, Ni, or TiAl target may be used.

The sputtering device may be of any type, such as an in-line type, a batch type, or a single piece type.

Next, a conductive layer is formed on the adhesive layer by sputtering.

Formation of the conductive layer is achieved by applying a voltage to a Cu target for a predetermined period of time.

The thickness thereof may be adjusted to be about 0.9 μm or greater and about 3.0 μm or smaller at a portion covering a side surface of the insulating substrate. In this case, the thickness at a portion covering the first main surface of the insulating substrate is about 3 μm or greater and about 10 μm or smaller.

Instead of the Cu target, a Ag or Al target may be used.

Next, an anticorrosive layer is formed on the conductive layer by sputtering, whereby an electronic component is obtained.

Formation of the anticorrosive layer is achieved by applying a voltage to a SUS target for a predetermined period of time.

The thickness thereof may be, for example, about 0.03 μm or greater and about 1.5 μm or smaller.

Instead of the SUS target, a Ti, Cr, Ni, TiAl, or permalloy target may be used. Using a material having a high magnetic permeability such as Ni or permalloy instead of the SUS target allows the shielding film to have an improved electromagnetic-shielding effect.

The electronic component may be a chip component or a substrate.

A component further including a passive element incorporated in the insulating substrate is an example of the electronic component used as a chip component.

Examples of the passive element include a capacitor and an inductor.

A component further including a different electronic component mounted on the insulating substrate is an example of the electronic component used as a substrate.

The different electronic component may be mounted on the first main surface and/or the second main surface of the insulating substrate.

Examples of the different electronic component include a multilayer ceramic capacitor and a multilayer chip coil.

The electronic component may be combined with a different electronic component and a substrate into a module.

The module may be a module including a substrate and an electronic component mounted on the substrate, for example.

An example of the module is a RF module.

EXAMPLES

The following provides examples that more specifically disclose the electronic component of the present disclosure. The present disclosure is not limited to these examples.

Example 1

Borosilicate glass powder containing CaO, $Al_2O_3$, $SiO_2$, and $B_2O_3$ was prepared as a starting material.

This borosilicate glass powder is a low temperature co-fired ceramic material.

The borosilicate glass powder was combined and mixed with appropriate amounts of a binder, a dispersing agent, a plasticizer, an organic solvent, and other components, whereby ceramic slurry was produced.

The ceramic slurry was degassed and formed into a green sheet having a thickness of 70 μm by a doctor blade method.

Next, the green sheet was punched so that it was provided with through holes and the through holes were filled with a silver-containing conductive paste, whereby via conductors were formed.

The silver-containing conductive paste contained glass powder, which is the low temperature co-fired ceramic contained in the green sheet (i.e., the conductive paste corresponds to a combined base material). The weight proportion of the low temperature co-fired ceramic material to the total weight of the metal and the low temperature co-fired ceramic material in the conductive paste was 10%.

The same conductive paste as the conductive paste filling the through holes was printed on the surface of the green sheet, whereby a conductive line layer to be a ground electrode was formed. In this step, the conductive line layer to be the first ground electrode exposed at a position closest to the first main surface of the insulating substrate and the conductive line layer to be the second ground electrode exposed at a position closest to the second main surface of the insulating substrate were made to have different thicknesses and lengths.

Then, 20 green sheets were stacked to form a stack and the stack was pressed in the thickness direction.

Next, the pressed stack was fired at 900° C., whereby an insulating substrate was obtained.

The low temperature co-fired ceramic material and the conductive paste were co-fired, whereby insulating layers, conductive line layers, and ground electrodes were formed.

For the thickness per single insulating layer formed after the firing, the thickness was 35 µm in the form of insulating layer in the case where the thickness was 70 µm in the form of green sheet. The resulting stack was singulated using a dicer and subjected to barrel finishing, whereby insulating substrates were obtained.

Each of the resulting insulating substrates had a substantially cubic shape having a length of 2000 µm, a width of 1250 µm, and a thickness of 700 µm.

Two ground electrodes were exposed to one side surface (a side surface having dimensions in a side view including a width of 1250 µm and a thickness of 700 µm) of the resulting insulating substrate at different positions of the insulating substrate. The ground electrode exposed at a position closest to the first main surface corresponds to the first ground electrode, while the ground electrode exposed at a position closest to the second main surface corresponds to the second ground electrode.

In a side view of the insulating substrate, the first ground electrode was at a position 150 µm apart from the first main surface, while the second ground electrode was at a position 150 µm apart from the second main surface. The distance between the first ground electrode and the second ground electrode in the thickness direction of the insulating substrate was 590 µm.

In a side view of the insulating substrate, the first ground electrode had a thickness of 10 µm and a length of 500 µm. In a side view of the insulating substrate, the second ground electrode had a thickness of 5 µm and a length of 200 µm.

The second main surface of the insulating substrate was provided with a first mounted electrode and a second mounted electrode. The first mounted electrode corresponds to a portion of the first ground electrode exposed to the second main surface of the insulating substrate through a via conductor. The second mounted electrode corresponds to a portion of the second ground electrode exposed to the second main surface of the insulating substrate through a via conductor. The first mounted electrode connected to the first ground electrode had a plan view area of 0.16 mm² and the second mounted electrode connected to the second ground electrode had a plan view area of 0.16 mm².

<Formation of Conductive Films>

The insulating substrate was successively subjected to Ni electroplating and Sn electroplating, whereby Ni—Sn conductive films were formed on the surfaces of the ground electrodes.

Another insulating substrate after the plating treatments under the same conditions was cut and the cross section was observed by SEM to measure the thicknesses of the conductive films. The total thickness of the first conductive film was 5 µm and the total thickness of the second conductive film was 3 µm.

<Formation of Shielding Film>

The insulating substrate was placed inside the chamber of a sputtering device and the following layers were formed in the stated order so that the shielding film was formed, whereby an electronic component was produced. The thicknesses of the layers of the shielding film formed on the surface of the first ground electrode were adjusted to the following values: 1) Adhesive layer: SUS target, thickness 0.3 µm, 2) Conductive layer: Cu target, thickness 1.0 µm, 3) Anticorrosive layer: SUS target, thickness 0.7 µm.

Comparative Example 1

An insulating substrate was produced in the same procedure as in Example 1 except that the shape and thickness of the conductive paste printed on the green sheet were changed, that the thicknesses of the first ground electrode and the second ground electrode exposed to a side surface of the insulating substrate were both 10 µm, and that the lengths thereof were both 500 µm. Then, plating treatment and formation of a shielding film were performed under the same conditions as in Example 1, whereby an electronic component of Comparative Example 1 was obtained.

The first conductive film formed on the surface of the first ground electrode had a thickness of 5 µm.

The second conductive film formed on the surface of the second ground electrode had a thickness of 5 µm.

Example 2

An electronic component was produced in the same procedure as in Comparative Example 1 except that the weight proportion of the low temperature co-fired ceramic material contained in the conductive paste to be the second ground electrode was changed to 20% by weight.

The first ground electrode had an electrical resistivity of $2.0 \times 10^{-6}$ Ω·cm.

The second ground electrode had an electrical resistivity of $2.0 \times 10^{-3}$ Ω·cm.

The first conductive film formed on the surface of the first ground electrode had a thickness of 5 µm.

The second conductive film formed on the surface of the second ground electrode had a thickness of 2 µm.

Example 3

An electronic component was produced in the same procedure as in Comparative Example 1 except that the plan view dimension of the second mounted electrode connected to the second ground electrode was changed from 0.16 mm² to 0.08 mm².

The first conductive film formed on the surface of the first ground electrode had a thickness of 5 µm.

The second conductive film formed on the surface of the second ground electrode had a thickness of 2 µm.

<Measurement of Peeling Strength of Shielding Film>

Cellotape® (available from Nichiban Co., Ltd.) was attached to the surface of the shielding film of the electronic component according to each of the examples and the comparative example for a peeling test.

The electronic components of Examples 1 to 3 suffered no peeling of the shielding film, while the electronic component of Comparative Example 1 suffered peeling of the shielding film formed on the surface of the second ground electrode.

These results demonstrate that the electronic component of the present disclosure exhibits good adhesion of the shielding film and excellent electrical connection.

<High Temperature Exposure Test>

The electronic components according to the examples and the comparative example 1 were maintained at 150° C. for 2000 hours and the variation in resistivity before and after the test was determined.

The electronic components of Examples 1 to 3 showed a resistivity variation of lower than 3%, while the electronic component of Comparative Example 1 showed a resistivity variation of greater than 3% and not greater than 5%.

These results demonstrate that the electronic component of the present disclosure exhibits a reduced resistivity variation under high-temperature conditions and therefore has excellent reliability.

1: electronic component
1a: first main surface of electronic component
1b: second main surface of electronic component
1c: first side surface of electronic component
1d: second side surface of electronic component
1e: third side surface of electronic component
1f: fourth side surface of electronic component
10, 12, 14, 16: insulating substrate
10a, 12a, 14a, 16a: first main surface of insulating substrate
10b, 12b, 14b, 16b: second main surface of insulating substrate
10c, 12c, 14c, 16c: first side surface of insulating substrate
10d, 12d, 14d, 16d: second side surface of insulating substrate
10e, 12e, 14e, 16e: third side surface of insulating substrate
10f, 12f, 14f, 16f: fourth side surface of insulating substrate
30a, 32a, 34a, 36a, 37a: first ground electrode
30b, 32b, 34b, 36b, 37b, 38b: second ground electrode
40a: first conductive film
40b: second conductive film
50: shielding film

The invention claimed is:

1. An electronic component comprising:
an insulating substrate including a first main surface, a second main surface, a side surface and a plurality of ground electrodes, the first main surface and the second main surface being opposite to each other in a thickness direction, and the plurality of ground electrodes being exposed to the side surface;
conductive films each covering a surface of a corresponding one of the plurality of ground electrodes exposed to the side surface of the insulating substrate; and
a shielding film covering the first main surface and the side surface of the insulating substrate and surfaces of the conductive films,
the plurality of ground electrodes including a first ground electrode and a second ground electrode on a same side surface of the insulating substrate, the first ground electrode being exposed to the side surface of the insulating substrate at a position closest to the first main surface of the insulating substrate and the second ground electrode being exposed to the side surface of the insulating substrate at a position closest to the second main surface of the insulating substrate,
the conductive films including a first conductive film covering a surface of the first ground electrode and a second conductive film covering a surface of the second ground electrode,
a thickness of the second conductive film being less than a thickness of the first conductive film.

2. The electronic component according to claim 1, wherein the shielding film is not electrically connected to an electrode provided at the second main surface of the insulating substrate.

3. The electronic component according to claim 1, wherein an electrical resistivity of the second ground electrode is higher than an electrical resistivity of the first ground electrode.

4. The electronic component according to claim 1, wherein a contact area between the second ground electrode and the second conductive film is smaller than a contact area between the first ground electrode and the first conductive film.

5. The electronic component according to claim 1, wherein a total area of the second ground electrode exposed to a surface of the insulating substrate is smaller than a total area of the first ground electrode exposed to the surface of the insulating substrate.

6. The electronic component according to claim 1, wherein the first conductive film and the second conductive film are apart from each other.

7. The electronic component according to claim 1, wherein the first conductive film and the second conductive film have different compositions.

8. The electronic component according to claim 1, wherein the first conductive film covers only the surface of the first ground electrode and a vicinity thereof and the second conductive film covers only the surface of the second ground electrode and a vicinity thereof.

9. The electronic component according to claim 2, wherein an electrical resistivity of the second ground electrode is higher than an electrical resistivity of the first ground electrode.

10. The electronic component according to claim 2, wherein a contact area between the second ground electrode and the second conductive film is smaller than a contact area between the first ground electrode and the first conductive film.

11. The electronic component according to claim 3, wherein a contact area between the second ground electrode and the second conductive film is smaller than a contact area between the first ground electrode and the first conductive film.

12. The electronic component according to claim 2, wherein a total area of the second ground electrode exposed to a surface of the insulating substrate is smaller than a total area of the first ground electrode exposed to the surface of the insulating substrate.

13. The electronic component according to claim 3, wherein a total area of the second ground electrode exposed to a surface of the insulating substrate is smaller than a total area of the first ground electrode exposed to the surface of the insulating substrate.

14. The electronic component according to claim 4, wherein a total area of the second ground electrode exposed to a surface of the insulating substrate is smaller than a total area of the first ground electrode exposed to the surface of the insulating substrate.

15. The electronic component according to claim 2, wherein the first conductive film and the second conductive film are apart from each other.

16. The electronic component according to claim 3, wherein the first conductive film and the second conductive film are apart from each other.

17. The electronic component according to claim 4, wherein the first conductive film and the second conductive film are apart from each other.

18. The electronic component according to claim 5, wherein the first conductive film and the second conductive film are apart from each other.

19. The electronic component according to claim 2, wherein the first conductive film and the second conductive film have different compositions.

20. The electronic component according to claim 3, wherein the first conductive film and the second conductive film have different compositions.

* * * * *

UNITED STATES PATENT AND TRADEMARK OFFICE
CERTIFICATE OF CORRECTION

| | |
|---|---|
| PATENT NO. | : 12,482,713 B2 |
| APPLICATION NO. | : 18/067844 |
| DATED | : November 25, 2025 |
| INVENTOR(S) | : Ikuo Deguchi |

It is certified that error appears in the above-identified patent and that said Letters Patent is hereby corrected as shown below:

In the Specification

Column 16, Line 34, "of $2.0 \times 10^{-3}$" should be --of $2.0 \times 10^{-5}$--

Signed and Sealed this
Thirteenth Day of January, 2026

John A. Squires
*Director of the United States Patent and Trademark Office*